United States Patent [19]

Lammert

[11] Patent Number: 4,711,017

[45] Date of Patent: Dec. 8, 1987

[54] FORMATION OF BURIED DIFFUSION DEVICES

[75] Inventor: Michael D. Lammert, Manhattan Beach, Calif.

[73] Assignee: TRW Inc., Redondo Beach, Calif.

[21] Appl. No.: 835,571

[22] Filed: Mar. 3, 1986

[51] Int. Cl.$^4$ ............................................. H01L 21/00
[52] U.S. Cl. .......................................... 437/20; 357/68; 357/34; 148/DIG. 147; 156/643; 156/653; 437/67; 437/72
[58] Field of Search ............ 29/576 W, 580; 156/643, 156/644, 647, 652, 653; 148/DIG. 50; 357/68

[56] References Cited

U.S. PATENT DOCUMENTS

| | | | |
|---|---|---|---|
| 4,044,452 | 8/1977 | Abbas | 29/576 W |
| 4,160,991 | 7/1979 | Anantha et al. | 357/68 |
| 4,353,086 | 10/1982 | Jaccodine et al. | 29/576 W |
| 4,446,476 | 5/1984 | Issac et al. | 357/68 |
| 4,455,740 | 6/1984 | Iwai | 357/23.4 |
| 4,466,180 | 8/1984 | Soclof | 29/580 |
| 4,520,552 | 6/1985 | Arnould et al. | 156/644 |
| 4,528,047 | 7/1985 | Beyer et al. | 156/644 |
| 4,631,803 | 12/1986 | Hunter et al. | 156/653 |

FOREIGN PATENT DOCUMENTS

| | | |
|---|---|---|
| 34942 | 3/1983 | Japan . |
| 106146 | 6/1984 | Japan . |
| 167029 | 9/1984 | Japan . |

*Primary Examiner*—Brian E. Hearn
*Assistant Examiner*—Beverly A. Pawlikowski
*Attorney, Agent, or Firm*—David W. Collins

[57] ABSTRACT

A low collector parasitic resistance in bipolar transistors may be achieved without the use of an epitaxial layer or a high energy implant. Essentially, the invention employs the use of trenches in an N⁻ layer overlying a P⁻ substrate to surround the transistor, forming an N⁺ region in the walls defining the trench and below the surface, extending the trench into the P⁻ substrate, implanting the bottom of the trench with a P-type dopant and refilling the trench with insulating material.

The process of the invention permits fabrication of complex bipolar integrated circuits having a very high performance, and is particularly adaptable to very small geometry devices of 1 μm and lower.

48 Claims, 10 Drawing Figures

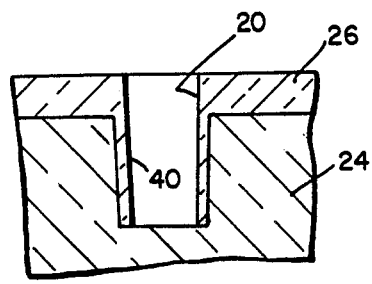
Fig. 6.
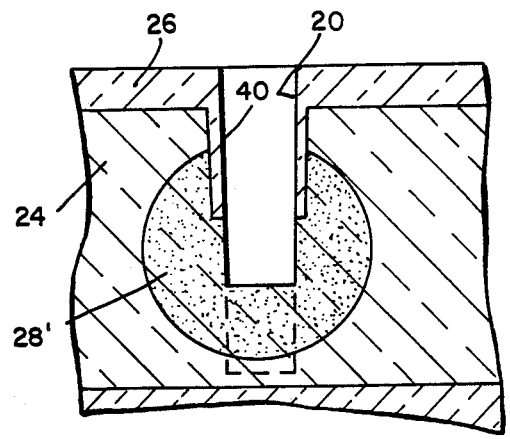
Fig. 7.
Fig. 8.
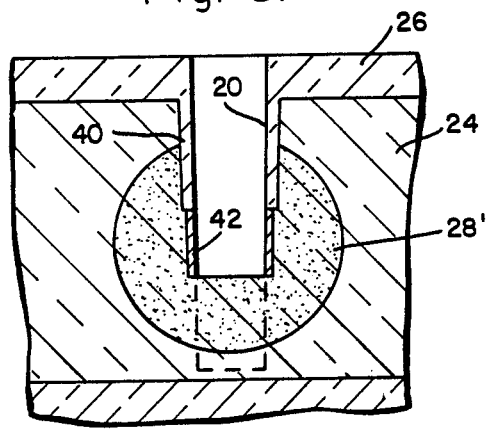
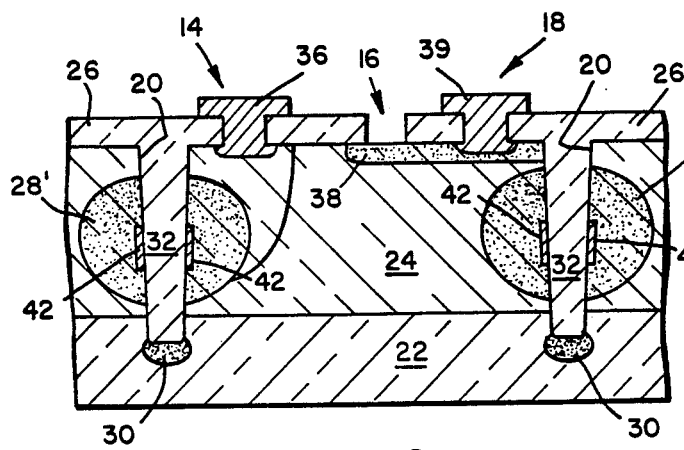
Fig. 9.
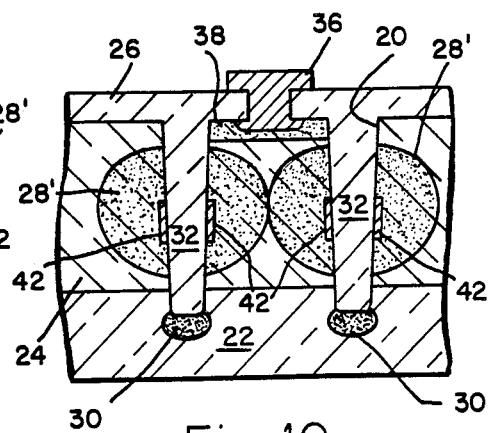
Fig. 10.

FORMATION OF BURIED DIFFUSION DEVICES

BACKGROUND OF THE INVENTION

This invention relates to bipolar transistors which operate at high frequencies, and, more particularly, to a process for fabricating such bipolar transistors having a low parasitic collector resistance.

The conventional processing of bipolar transistors having a collector, base and emitter involves forming a buried N+ layer, using ion implantation (e.g., an arsenic species) or diffusion (e.g., an antimony species) to achieve a sheet resistance of about 5 to 20 ohms per square in a P− substrate. An N− epitaxial layer, doped with phosphorus or arsenic, is then grown to a thickness of about 1 to 5 $\mu$m (somewhat thinner for a higher packing density of devices). An isolation layer is formed by diffusing a P+ region down to the P− substrate, using, e.g., a boron dopant species, to achieve a sheet resistance of about 30 to 100 ohms per square.

The P+ isolation region is typically 4 to 7 $\mu$m wide and driven to a depth of 3 to 5 $\mu$m. Employing this technology limits the spacing between isolated devices to 12 to 20 $\mu$m.

In the prior art, a P+ layer is typically placed away from the device, penetrating 4 $\mu$m down and 6 $\mu$m wide at the surface. This results in devices spaced 18 $\mu$m apart. Employing the process of the present invention permits increasing the packing density to put five devices in the same space occupied by one device in the prior art.

An N+ region, employing a fast diffuser dopant such as phosphorus, is diffused down to the N+ buried layer to form the collector contact. The base contact is formed by means of a P-type implant or diffusion, using, e.g., boron as the dopant. The emitter contact is formed with an N+ diffused region by implantation or diffusion, using, e.g., phosphorus or arsenic, or by forming an N+ polysilicon layer doped with, e.g., phosphorus or arsenic. Contacts are opened by etching. Resistors are optionally formed as P-diffused regions or as surface thin film devices. Metallization to form connections to the devices typically employs aluminum, aluminum-1% silicon or an aluminum film in conjunction with a refractive metal barrier layer, such as titanium or titanium-tungsten.

Such devices, being diffusion isolated, are large. Trenches have been employed to isolate the devices to reduce the size of the devices. Formation of trenches has typically involved anisotropically etching a trench down to the P− substrate, using a plasma dry etch such as chlorine plus silicon tetrachloride or chlorine plus carbon tetrachloride. The trenches are then filled and planarized with a dielectric material, such as silicon dioxide, polysilicon or silicon nitride.

The operation of a bipolar transistor at high frequencies requires the device to have a low parasitic collector resistance. One conventional method for reducing the parasitic collector resistance is to form the transistor in a lightly doped epitaxial layer that has been grown over a heavily doped buried layer. Although this is effective in reducing the collector parasitic resistance, the defect density associated with grooving an epitaxial layer potentially prohibits the fabrication of integrated circuits with large numbers of transistors.

A second method of achieving a low collector parasitic resistance uses a high energy implanted buried layer. However, this method also has a potential problem of defects generated during the implantation. Further, it is difficult to maintain a sufficiently low dopant concentration in the region of the base junction unless a very high energy (1 to 3 MEV) is used to implant the buried layer.

One final method of achieving a low parasitic collector resistance that does not use a buried layer is described in U.S. Pat. No. 4,044,452. After etching a trench around the perimeter of a transistor, the bottom of the trench is implanted with an N+ dopant. Diffusion of the dopant forms a buried layer similar to the process described in the present patent application. However, the lateral diffusion of the dopant requires the spacing between adjacent isolated transistors to be nearly the same as a conventional device having a buried layer. Therefore, this method of achieving a low parasitic collector resistance does not lend itself to building high device density integrated circuits.

Thus, a need remains for a process for providing a bipolar transistor with a low collector resistance and a low defect density, together with a high device packing density.

OBJECTS AND SUMMARY OF THE INVENTION

Accordingly, it is an object of the present invention to provide a bipolar transistor having a low collector parasitic resistance.

It is a further object of the present invention to provide a bipolar transistor having a low collector parasitic resistance and omitting the use of an epitaxial layer or a high energy implant to achieve a low defect density on very high device count integrated circuits.

These and further objects of the invention will become more apparent upon a consideration of the following commentary taken in conjunction with the drawing.

Briefly, prior to forming the base and emitter regions of the bipolar transistor, the collector is formed by the following process (a) providing a P-type wafer;

(b) forming lightly doped N regions or a blanket N region in the P-type wafer;

(c) etching a vertical trench to define the perimeter of the transistor (including the base, collector and emitter);

(d) forming an N+ region in the bottom of the trench;

(e) driving the N+ region to a depth of about one-half the width of the device;

(f) further etching the trench past the diffused N+ region;

(g) implanting the bottom of the trench with a P-type dopant; and (h) refilling the trench with an insulating material.

The collector plug, base region, emitter region, contacts and metallization are then formed as is conventional in the fabrication of this type of device.

In one embodiment, the N+ region is formed in the bottom of the trench in step (d) by implantation with a heavy dose of N-type ions.

In a second embodiment, after step (c), the trench walls and bottom are oxidized, the bottom oxide is removed by an anisotropic etchant and the trench is etched an additional depth. In step (d), the N+ region in the bottom of the trench is formed by diffusing, rather than implanting, an N-type species into the silicon. The remaining process then follows that described for the first embodiment.

A third method for achieving low collector parasitic resistance is similar to the second embodiment, except that after the N+ diffusion in step (d) a metal silicide is formed on the exposed N+ diffused region of the trench walls. After an anisotropic etch to remove the bottom silicide and to etch the trench past the N+diffusion, a silicide region is left on the side of the trench. The remaining processing is identical to that described in the first embodiment.

The foregoing process employs an isolation trench, and eliminates the need for an epitaxial layer. A quasi-buried N+ layer is formed, but not in the manner as is conventionally done.

The primary advantage of the new process of the invention is the ability to fabricate complex bipolar integrated circuits having a very high performance, with low parasitic collector resistance. It should be possible to achieve the defect densities of other non-epi VLSI technologies, such as 1 $\mu$m triple-diffused bipolar or 1 $\mu$m CMOS, while achieving the performance of high speed bipolar technologies. This invention is particularly adaptable to very small geometry devices, 1 $\mu$m and smaller, since the device achieve optimum performance at narrow widths.

BRIEF DESCRIPTION OF THE DRAWING

FIG. 6 is a view similar to that of FIG. 2, but showing only one portion of a trench in a second embodiment;

FIG. 7 is a view also similar to that of FIG. 2, but showing the results of additional processing of the second embodiment;

FIG. 8 is a view similar to that of FIG. 7, but showing a third embodiment;

FIG. 9 is a view similar to that of FIG. 4, but showing results of additional processing of the third embodiment; and FIG. 10 is a view similar to that of FIG. 5, but showing results of additional processing of the third embodiment.

DETAILED DESCRIPTION OF THE PREFERRED EMBODIMENTS

Figure 1:
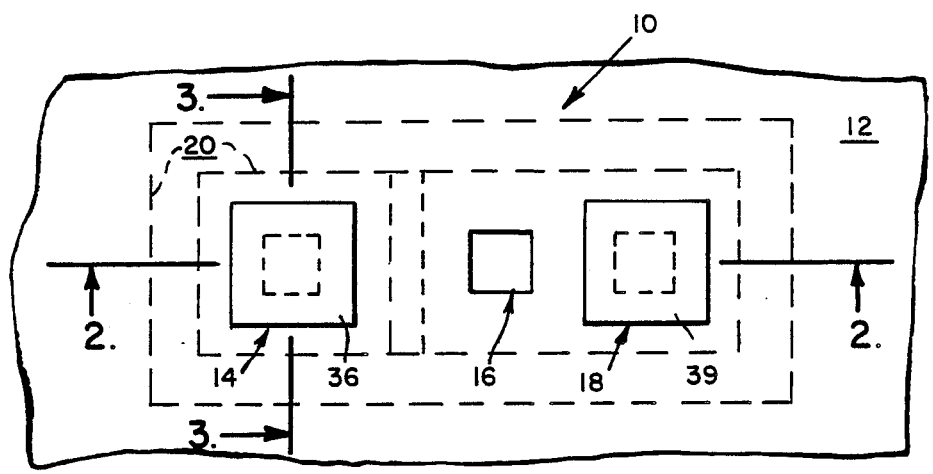
FIG. 1 is a top plan view showing a complete bipolar transistor surrounded by an insulating trench.

Referring now to the drawing wherein like numerals of reference designate like elements throughout, a bipolar transistor, shown generally at 10 in FIG. 1, is depicted on a substrate 12. The transistor 10 comprises a collector region 14, a base region 16 and an emitter region 18. An insulating trench 20 surrounds the device and isolates the bipolar transistor 10 from neighboring devices (not shown).

Figure 2:
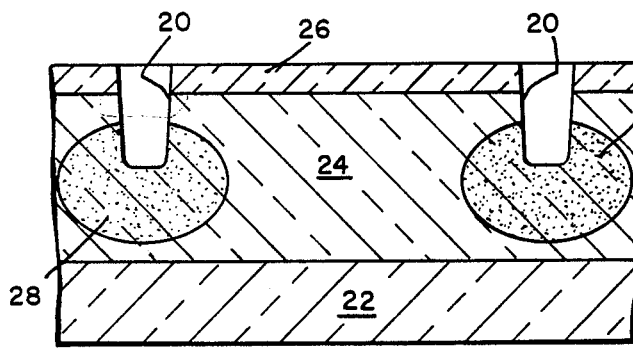
FIG. 2 is a cross-sectional view taken along the line 2—2 of FIG. 1, but depicting an earlier stage of processing.
Figure 3:
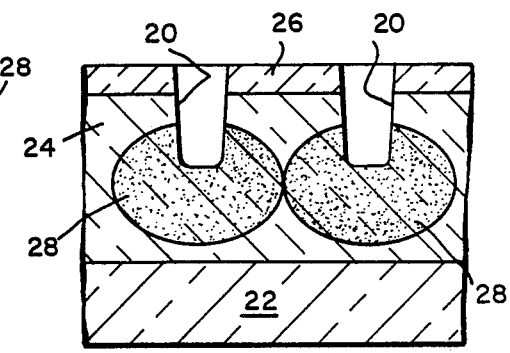
FIG. 3 is a cross-sectional view taken along the line 3—3 of FIG. 1, also depicting an earlier stage of processing.

As shown in FIGS. 2 and 3, the wafer includes a lightly doped P− substrate, layer 22, over which a blanket or patterned, lightly doped N− layer 24 has been formed. An insulating layer 26, such as silicon dioxide, is formed on the surface on the N− layer 24. The process employed in the formation of N− layer 24 is by conventional ion implantation or diffusion, while the process employed in the formation of the insulating layer 26 is by conventional thermal oxidation or deposition.

In accordance with the invention, the trench 20 is formed, extending partway into the N− layer 24. While the formation of the trench 20 itself is not considered novel, its use conjunction with the following processing steps provides the low collector resistance desired and closer spacing of devices 10.

The trench 20 is formed by conventional anisotropic etching techniques and, for devices 10 of typical widths of 2 to 3 $\mu$m, the trench is initially etched to a depth of about 1.2 to 1.5 $\mu$m.

In a first embodiment of the invention, an N+ species is implanted at a high dose of about $1 \times 10^{15}$ to $2 \times 10^{16}$ cm$^{-2}$. The N+ species may comprise any of the elements of arsenic, phosphorus or antimony. The N+ species is implanted into the bottom of the trench, preferably employing an implant energy of about 20 to 200 keV.

The N+ species is then driven by diffusion to form N+ regions 28; the diffusion is performed until the N+ regions 28 on either side of the device 10 meet or nearly meet (that is, diffuse to a depth of about one-half the width of the device 10), as shown in FIG. 3. The diffusion of the N+ region 28 is conveniently done at a temperature ranging from about 950° to 1100° C. over a period of time of about 1 to 10 hours, with the shorter times associated with the higher temperatures and faster diffusing species.

Figure 4:
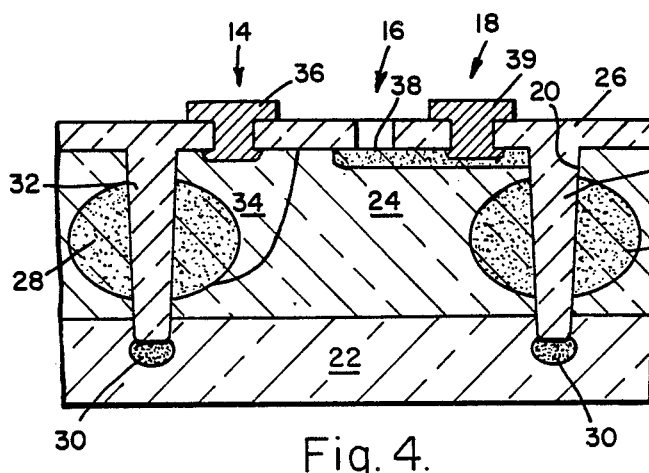
FIG. 4 is a view similar to that of FIG. 2, but showing the results of additional processing.
Figure 5:
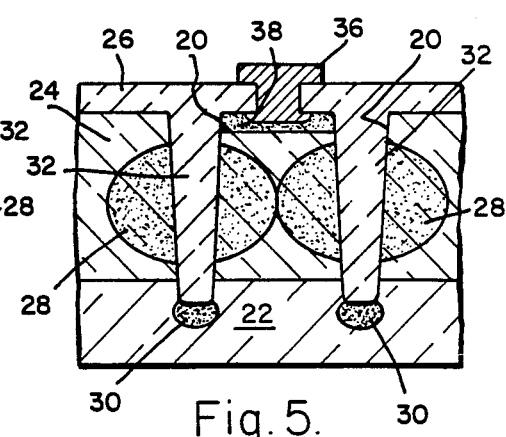
FIG. 5 is a view similar to that of FIG. 3, but also showing the results of additional processing.

The trench 20 is then etched to a depth of about 0.5 $\mu$m or greater past the N+ diffusion region 28, into the P− layer 22, as shown in FIGS. 4 and 5.

A P+ enhancement implant region 30 is formed in the bottom of the trench, having an implant dose of about $10^{13}$ to $10^{15}$ cm$^{-2}$. A lower energy is employed, to keep the implant near the surface of the bottom of the trench. Energy ranges from about 25 to 75 keV are preferred. Any excessive temperatures in subsequent processing should be avoided, in order to prevent diffusion of the P+ region 30 into the N+ region 24. If this happens, an undesirably low collector-substrate breakdown voltage may result.

The foregoing P+ enhancement implant region 30 could be omitted if a heavily doped P-type substrate, rather than a lightly doped P-type substrate, is employed. Otherwise, its omission will result in devices evidencing leakage between collector regions due to surface inversion of the P-type region at the bottom of the trench 20.

The trench 20 is then refilled with insulating material 32, as is conventional. If a dielectric other than silicon dioxide is employed as the insulating layer 26, it may be desirable to oxidize the sidewalls of the trench 20 prior to filling the trench with the dielectric material. Desirably, thermally grown or deposited doped or undoped SiO$_2$ films are employed for both the insulating layer 26 and refill material 32, although refill materials of polysilicon, silicon nitride, aluminum oxide or any combination thereof may be used.

The remainder of the processing is that conventionally employed for fabricating the collector 14, an N+ collector region 34 and an N+ polysilicon plug 36, the base 16 and its associated P-type base region 38, the emitter 18, a polysilicon emitter plug 39, contacts and metallization. For the sake of clarity, the contacts and metallization have been omitted from FIGS. 4 and 5.

Alternatively, the N+ polysilicon plug 36 may be deleted and direct contact may be made to the N+ collector region 34. Also, the N+ polysilicon emitter 39 may be replaced by an N+ ion implanted or diffused N+ emitter. Further, metal may directly contact the polysilicon N+ collector and emitter regions, or an additional insulating dielectric may be grown or deposited over the polysilicon. Then contacts may be etched in the groove or deposited insulating layer.

While the collector resistance of the first embodiment described above is lower than that achieved in conventional processing of a triple diffused bipolar device, which does not employ an N+ buried layer, an even lower collector resistance may be achieved by the following processing.

In the first embodiment, described above, extending the trench 20 through the N+ region 28 in the bottom of the trench 20 by etching results in a loss of a considerable amount of implant dopant, since the highest concentration of the implant is in the bottom of the trench 20 after the implant distribution. This second embodiment improves the conductivity of the N+ buried region 28.

The trench 20 is etched as in the first embodiment to about the same depth. However, in the second embodiment, an oxide is grown along the trench walls to form an oxide region 40. A wet thermal oxidation is preferably used, ranging in temperature from about 900° to 1100° C. Preferably, to achieve a lower defect density, a temperature of about 1050° C. is employed. Oxidizing at this temperature for a period of time ranging from about 10 to 30 minutes results in an oxide having a thickness ranging from about 1000 to 3000 Angstroms.

An anisotropic etchant is used to etch away the oxide from the bottom of the trench 20, resulting in the structure shown in FIG. 6. The trench 20 is then etched for another approximately 0.5 to 1 μm, to expose a portion of the trench walls not covered with the oxide 40.

An N+ species, preferably phosphorus, is then diffused into the trench 20. Preferably, phosphine gas (PH₃) or POCl₃ is employed, diffused at temperatures ranging from about 850° to 1050° C. for a time ranging from about 10 minutes to 1 hour, with the shorter times associated with the higher temperatures. The diffusion occurs in the exposed portions of the lower trench walls and the bottom of the trench.

The N+ diffusion is then driven, as above, so as to get more N+ species out away from the trench 20, to achieve a resistivity of about 5 to 20 ohms per square.

The trench 20 is etched as in the first embodiment, described above, to extend the trench depth about 0.5 μm beyond the end of the diffused region 28', as shown in phantom in FIG. 7.

The trench 20 is then refilled as in the first embodiment and the rest of the processing continued as described above.

A third embodiment is provided, which is similar to the second embodiment, except that after the N+ diffusion, a metal silicide 42 is formed on the exposed walls of the trench 20 in the N+ diffused region. This is done after the formation of the diffused region 28' but prior to the extension of the trench 20, as shown in FIG. 8.

The silicide 42 may be any of the metal silicides such as tungsten, titanium, tantalum, molybdenum or other refractory metal. The silicide 42 is formed by first depositing the refractory metal onto the surface of the N+ diffused region 28' in the trench 20 and then annealing. The metal deposition is accomplished by any convenient process, such as sputtering or low pressure chemical vapor deposition. The annealing is accomplished by a rapid thermal anneal, for about 5 to 30 seconds at a temperature ranging from about 750° to 1100° C. A furnace anneal may alternatively be used, ranging in temperature from about 750° to 1000° C. for about 10 to 30 minutes.

The silicide 42 in the bottom of the trench 20 is anisotropically etched to remove the same and the trench 20 is further extended by etching and then refilled as in the second embodiment, resulting in the structure depicted in FIGS. 9 and 10. The silicide 42 remaining on the side walls of the trench 20 provides a high conductivity, low buried resistance underneath the device around the perimeter of the device.

While the foregoing processes have application for bipolar devices, they will also find application in MOS devices where one might otherwise form a buried layer by an epitaxial or a deep implantation process. The foregoing process would enable one to eliminate the epitaxial or deep implantation process that may be used to enhance the radiation hardness of the CMOS devices.

The foregoing process may also be used in fabricating other similar devices based on GaAs and other III-V and II-VI semiconductor materials technology to provide an isolated, heavily doped region underneath the surface of the device.

Thus, there has been provided a process for forming buried diffusion devices, particularly suitable for reducing the collector resistance of bipolar transistors. Various changes and modifications will make themselves apparent to those of ordinary skill in the art, and all such changes and modifications are considered to be within the scope of the invention as defined by appended claims.

What is claimed is:

1. A process for reducing collector parasitic resistance in a bipolar transistor having a collector, base and emitter, suitable contacts and metallization thereto, the process for forming said collector comprising:
   (a) providing a P-type substrate;
   (b) forming at least one lightly doped N⁻ region in the P-type substrate;
   (c) etching a vertical trench in said N⁻ region to define the perimeter of said transistor;
   (d) forming an N+ region in the bottom of said trench;
   (e) driving said N+ region to a depth of about one-half the width of the device;
   (f) etching said trench past said N+ region into said P-type substrate region;
   (g) forming a P+ region in the bottom of said trench; and
   (h) refilling said trench with insulating material.

2. The process of claim 1 in which said N+ region is formed by implantation.

3. The process of claim 2 in which said N+ region is implanted at a dose of about $1 \times 10^{15}$ to $2 \times 10^{16}$ cm⁻², employing an implant energy of about 20 to 200 keV.

4. The process of claim 3 in which said implantation employs an element selected from the group consisting of arsenic, phosphorus and antimony.

5. The process of claim 1 in which said trench is initially etched to a depth of about 1.2 to 1.5 μm for devices of widths of about 2 to 3 μm.

6. The process of claim 1 in which said N+ region is driven by diffusion at a temperature ranging from about 950° to 1100° C. for a period of time ranging from about 1 to 10 hours.

7. The process of claim 1 in which said trench is etched at least about 0.5 μm past said diffused region.

8. The process of claim 1 in which said P+ region is formed by implantation.

9. The process of claim 8 in which said P+ region is implanted at a dose of about $10^{13}$ to $10^{15}$ cm$^{-2}$, employing an implant energy of about 25 to 75 keV.

10. The process of claim 9 in which said implantation employs boron.

11. The process of claim 1 wherein said insulating material comprises thermally grown silicon dioxide, deposited doped or undoped silicon dioxide, silicon nitride, polysilicon, aluminum oxide, or combinations thereof.

12. The process of claim 1 in which following step (c), the following process occurs:
(c1) oxidizing the walls of said trench;
(c2) anisotropically etching to remove oxide formed on the bottom of said trench;
(c3) etching said trench an additional amount to expose silicon along a portion of said walls of said trench; and
(d') diffusing an N-type species into said exposed silicon in said trench to form an N+ region.

13. The process of claim 12 in which said walls of said trench are oxidized by a wet thermal process, employing a temperature of about 900° to 1100° C. for a period of time necessary to grow an oxide having a thickness of about 1000 to 3000 Angstroms.

14. The process of claim 12 wherein said trench is etched an additional amount of about 0.5 to 1 μm.

15. The process of claim 12 wherein said N+ region is formed by decomposition of PH$_3$ or POCl$_3$ at a temperature ranging from about 850° to 1050° C. for a period of time ranging from about 10 minutes to 1 hour.

16. The process of claim 12 in which the following step (d'), the following processing occurs:
(d1) forming a metal silicide on the exposed walls of said trench, on said N+ diffused region; and
(d2) anisotropically etching the bottom of said trench to remove silicon formed thereon.

17. The process of claim 16 in which said silicide comprises a refractory metal silicide.

18. The process of claim 17 in which the refractory metal comprises a member selected from the group consisting of tungsten, titanium, tantalum and molybdenum.

19. A process for reducing collector parasitic resistance in a bipolar transistor having a collector, base and emitter and suitable contacts and metallization thereto, the process for forming said collector comprising:
(a) providing a P-type substrate;
(b) forming a lightly doped N− region in the P-type substrate;
(c) etching a vertical trench in said N− region to define the perimeter of said transistor;
(d) forming an N+ region in the bottom of said trench by ion implantation, employing a species selected from the group consisting of arsenic, phosphorus or antimony and implanting at a dose of about $1 \times 10^{15}$ to $2 \times 10^{16}$ cm$^{-2}$ and an implant energy of about 20 to 200 keV;
(e) driving said N+ region by diffusion to a depth of about one-half the width of the device;
(f) etching said trench past said diffused region;
(g) forming a P+ region in the bottom of said trench by ion implantation, employing boron and implanting at a dose of about $10^{13}$ to $10^{15}$ cm$^{-2}$ and a implant energy of about 25 to 75 keV; and
(h) refilling said trench with insulating material.

20. The process of claim 19 in which said trench is initially etched to a depth of about 1.2 to 1.5 μm for devices of widths of about 2 to 3 μm.

21. The process of claim 19 in which said N+ region is driven by diffusion at a temperature ranging from about 950° to 1100° C. for a period of time ranging from about 1 to 10 hours.

22. The process of claim 19 in which said trench is etched at least about 0.5 μm past said diffused region.

23. The process of claim 19 in which said P+ region is formed by implantation.

24. The process of claim 19 wherein said insulating material comprises thermally grown silicon dioxide, deposited doped or undoped silicon dioxide, silicon nitride, polysilicon, aluminum oxide, or combinations thereof.

25. A process for reducing collector resistance in a bipolar transistor having a collector, base and emitter and suitable contacts and metallization thereto, the process for forming said collector comprising:
(a) providing a P-type substrate;
(b) forming a lightly doped N region in the P-type substrate;
(c) etching a vertical trench in said N− region to define the perimeter of said transistor;
(d) oxidizing the walls of said trench;
(e) anisotropically etching to remove oxide formed on the bottom of said trench;
(f) etching said trench an additional amount within said N− region to expose silicon along a portion of the walls of said trench;
(g) diffusing an N-type species into said exposed silicon of said trench to form a N+ region;
(h) driving said N+ region by diffusion to a depth of about one-half the width of the device;
(i) etching said trench past said diffused region into said P-type substrate;
(j) forming a P+ region in the bottom of said trench; and
(k) refilling said trench with insulating material.

26. The process of claim 25 in which said trench is initially etched to a depth of about 1.2 to 1.5 μm for devices of widths of about 2 to 3 μm.

27. The process of claim 25 in which said N+ region is driven by diffusion at a temperature ranging from about 950° to 1100° C. for a period of time ranging from about 1 to 10 hours.

28. The process of claim 25 in which said trench is etched at least about 0.5 μm past said diffused region.

29. The process of claim 25 in which said P+ region is formed by implantation.

30. The process of claim 29 in which said P+ region is implanted at a dose of about $10^{13}$ to $10^{15}$ cm$^{-2}$, employing an implant energy of about 25 to 75 keV.

31. The process of claim 30 in which said implantation employs boron.

32. The process of claim 25 wherein said insulating material comprises thermally grown silicon dioxide, deposited doped or undoped silicon dioxide, silicon nitride, polysilicon, aluminum oxide, or combinations thereof.

33. The process of claim 25 in which said walls of said trench are oxidized by a wet thermal process, employing a temperature of about 900° to 1100° C. for a period of time necessary to grow an oxide having a thickness ranging from about 1000 to 3000 Angstroms.

34. The process of claim 25 wherein said trench is etched an additional amount of about 0.5 to 1 μm.

35. The process of claim 25 wherein said N+ region is formed by decomposition of PH$_3$ or POCl$_3$ at a temperature ranging from about 850° to 1050° C. for a period of time ranging from about 10 minutes to 1 hour.

36. A process of reducing collector resistance in a bipolar transistor having a collector, base and emitter and suitable contacts and metallization thereto, the process for forming said collector comprising:
(a) providing a P-type substrate;
(b) forming a lightly doped N− region in the P-type substrate;
(c) etching a vertical trench in said N− region to define the perimeter of said transistor;
(d) oxidizing the walls of said trench;
(e) anisotropically etching to remove oxide formed on the bottom of said trench;
(f) etching said trench an additional amount within said N− region to expose silicon along a portion of the walls of said trench;
(g) diffusing an N-type species into the exposed silicon of said trench to form an N+ region;
(h) driving said N+ region by diffusion to a depth of about one-half the width of the device;
(i) forming a metal silicide on the exposed walls of said trench, on said N+ diffused region;
(j) anisotropically etching the bottom of said trench to remove the silicide formed thereon;
(k) etching said trench past said diffused region into said P-type substrate;
(l) forming a P+ region in the bottom of said trench; and
(m) refilling said trench with insulating material.

37. The process of claim 36 in which said trench is initially etched to a depth of about 1.2 to 1.5 μm for devices of widths of about 2 to 3 μm.

38. The process of claim 36 in which said N+ region is driven by diffusion at a temperature ranging from about 950° to 1100° C. for a period of time ranging from about 1 to 10 hours.

39. The process of claim 36 in which said trench is etched at least about 0.5 μm past said diffused region.

40. The process of claim 36 in which said P+ region is formed by implantation.

41. The process of claim 40 in which said P+ region is implanted at a dose of about $10^{13}$ to $10^{15}$ cm$^{-2}$, employing an implant energy of about 25 to 75 keV.

42. The process of claim 41 in which said implantation employs boron.

43. The process of claim 36 wherein said insulating material comprises thermally grown silicon dioxide, deposited doped or undoped silicon dioxide, silicon nitride, polysilicon, aluminum oxide, or combinations thereof.

44. The process of claim 36 in which said walls of said trench are oxidized by a wet thermal process, employing a temperature of about 900° to 1100° C. for a period of time necessary to grow an oxide having a thickness ranging from about 1000 to 3000 Angstroms.

45. The process of claim 36 wherein said trench is etched an additional amount of about 0.5 to 1 μm.

46. The process of claim 36 wherein said N+ region is formed by decomposition of PH$_3$ or POCl$_3$ at a temperature ranging from about 850° to 1050° C. for a period of time ranging from about 10 minutes to 1 hour.

47. The process of claim 36 in which said metal silicide comprises a refractory metal silicide.

48. The process of claim 47 in which the refractory metal comprises a member selected from the group consisting of tungsten, titanium, tantalum and molybdenum.

* * * * *